United States Patent
Corrochano

(10) Patent No.: US 10,094,877 B2
(45) Date of Patent: Oct. 9, 2018

(54) METHOD AND APPARATUS FOR DETERMINING PRESENCE AND OPERATION OF COMPONENTS IN A PRINTED CIRCUIT BOARD

(71) Applicant: NASA SOLUTIONS, LLC, Lake Zurich, IL (US)

(72) Inventor: Denis Corrochano, Algonquin, IL (US)

(73) Assignee: NASA SOLUTIONS, LLC, Lake Zurich, IL (US)

( * ) Notice: Subject to any disclaimer, the term of this patent is extended or adjusted under 35 U.S.C. 154(b) by 0 days.

(21) Appl. No.: 15/677,694

(22) Filed: Aug. 15, 2017

(65) Prior Publication Data

US 2017/0343606 A1 Nov. 30, 2017

Related U.S. Application Data

(63) Continuation-in-part of application No. 15/428,948, filed on Feb. 9, 2017.

(60) Provisional application No. 62/293,139, filed on Feb. 9, 2016, provisional application No. 62/375,733, filed on Aug. 16, 2016.

(51) Int. Cl.
| | | |
|---|---|---|
| G01N 21/25 | (2006.01) | |
| G01R 31/317 | (2006.01) | |
| G01J 3/51 | (2006.01) | |
| G01J 1/42 | (2006.01) | |
| G01J 1/44 | (2006.01) | |
| G01J 1/04 | (2006.01) | |
| G01J 1/02 | (2006.01) | |
| G01J 3/02 | (2006.01) | |
| G01J 3/50 | (2006.01) | |

(52) U.S. Cl.
CPC ...... *G01R 31/31728* (2013.01); *G01J 1/0204* (2013.01); *G01J 1/0228* (2013.01); *G01J 1/0492* (2013.01); *G01J 1/4204* (2013.01); *G01J 1/44* (2013.01); *G01J 3/0264* (2013.01); *G01J 3/505* (2013.01); *G01J 3/51* (2013.01); *G01J 3/513* (2013.01); *G01J 2001/4252* (2013.01)

(58) Field of Classification Search
CPC ...... G01J 3/51; G01J 3/02; G01J 3/513; G01J 3/2803; G01J 3/46
USPC ........................................................ 356/419
See application file for complete search history.

(56) References Cited

U.S. PATENT DOCUMENTS

| | | | | |
|---|---|---|---|---|
| 2005/0105094 A1* | 5/2005 | Schmitt | ..................... | G01J 1/42 356/419 |
| 2006/0170923 A1* | 8/2006 | Schmitt | ..................... | G01J 1/42 356/419 |
| 2009/0209816 A1* | 8/2009 | Gunther Nielsen | ... | A61B 1/267 600/118 |
| 2013/0228675 A1* | 9/2013 | Chen | ..................... | G01N 21/01 250/227.11 |
| 2014/0343806 A1* | 11/2014 | Kuhnel | ............... | G06F 11/2015 701/50 |
| 2015/0055134 A1* | 2/2015 | Papautsky | .............. | G01N 21/25 356/408 |
| 2015/0099949 A1* | 4/2015 | Wallace | .................. | A61B 5/742 600/323 |

(Continued)

*Primary Examiner* — Md M Rahman
(74) *Attorney, Agent, or Firm* — Pauley Erickson & Kottis

(57) ABSTRACT

A method and apparatus for determining a presence, color and/or brightness of a plurality of components in a printed circuit board, where the components are biased either with constant current or with a current pulse.

13 Claims, 7 Drawing Sheets

(56) References Cited

U.S. PATENT DOCUMENTS

2018/0017684 A1* 1/2018 Delodder .................. G01T 1/24

* cited by examiner

* The "Outputs" connector J4, outputs the color and intensity of the requested Light Pipe Channel in Frequency (Hz) and Voltage (V).

METHOD AND APPARATUS FOR DETERMINING PRESENCE AND OPERATION OF COMPONENTS IN A PRINTED CIRCUIT BOARD

CROSS REFERENCE TO RELATED APPLICATIONS

This application is a continuation-in-part application of application, U.S. Ser. No. 15/428,948, filed on 9 Feb. 2017, which claims the benefit of U.S. Provisional Patent Application Ser. No. 62/293,139, filed 9 Feb. 2016. The co-pending parent applications are hereby incorporated by reference herein and is made a part hereof, including but not limited to those portions which specifically appear hereinafter.

This application also claims the benefit of U.S. Provisional patent application Ser. No. 62/375,733, filed on 16 Aug. 2016. The co-pending Provisional Application is hereby incorporated by reference herein in its entirety and is made a part hereof, including but not limited to those portions which specifically appear hereinafter.

BACKGROUND OF THE INVENTION

Field of the Invention

This invention relates to a method and apparatus for testing for the presence, brightness and/or color of components in a printed circuit board, where the components are biased either with constant current or with a current pulse.

Description of Related Art

Printed circuit boards typically contain multiple components including: light emitting diodes (LEDs), resistors, capacitors, diodes, fuses, processors, and similar such components. Typically, verification of the presence of such components in a printed circuit board required powering up a fully rendered printed circuit board and manually verifying the presence of the correct components. Alternatively, a test fixture may be constructed including bulky and expensive fiber optics that extend between the printed circuit board to be tested and a test system.

Verification of the presence and operation of LEDs within a printed circuit board may be accomplished without a power supply such as described in U.S. Pat. No. 6,490,037, issued to Schmitt, which is hereby incorporated by reference in its entirety in a manner consistent with the present document. Further, verification of the presence and operation of LEDs within a printed circuit board may be accomplished such as described in U.S. Pat. Nos. 7,023,554; 7,227,639; and 7,265,822, each issued to Schmitt, which are also each hereby incorporated by reference in their entirety in a manner consistent with the present document. However, these known methods require a constant current for a sampling period.

Determination of the color and brightness of the components, include LEDs, beyond mere verification, typically requires extensive calibration and set-up to align sensors with the components and run the wiring necessary for sending numerous signals to determine such parameters of the components.

SUMMARY OF THE INVENTION

A method and apparatus for determination of presence, brightness and/or color of components in a printed circuit board according to a preferred embodiment of this invention eliminates much of the time-consuming and costly procedures required by manual determination and the equally costly test fixtures requiring time-intensive and complex set-up and calibration. For ease of explanation, the following description will primarily refer to LEDs however other components may be used with the method and apparatus of this invention.

The method and apparatus of this invention allows for testing for the presence, brightness and/or color of an LED in a printed circuit board, where the LED is biased with a constant current or with a current pulse while avoiding the time-consuming and costly procedures of previously known methods.

The apparatus according to a preferred embodiment of this invention preferably includes an enclosure module device that includes multiple sensors attached to fiber optic cables having a plurality of color receptors in a simple, easy to mount assembly. The device for determining at least one of a presence, a brightness and a color of components in printed circuit board preferably includes the sensors arranged within a housing or similar structure, hereinafter referred as module.

An input of the module may comprise either a USB or a serial connection. In a preferred embodiment, a command is provided to the module through a USB or serial cable, the module then samples a requested color sensor attached to fiber optic cables. The module sends back a color and/or an intensity reading back via the USB or the serial connection. The module will also update output pins with proper frequency (in Hz) and voltage (in volts) readings for component color and a voltage reading for the component intensity.

Accordingly, a method for testing for the presence, color and/or brightness of the component is described in additional detail below. Such method accomplishes readings of presence, color and/or brightness at a much higher speed and higher accuracy than prior art methods and apparatus and the module permits testing of multiple components that can be tested simultaneously without having to power up each component individually.

BRIEF DESCRIPTION OF THE DRAWINGS

The above-mentioned and other features and objects of this invention will be better understood from the following detailed description taken in conjunction with the drawings wherein.

DESCRIPTION OF PREFERRED EMBODIMENTS

A system and apparatus for determining a presence and/or brightness and/or color of an light emitting diode (LED) in a printed circuit board where the LED is biased with a constant current ("DC Mode") or is biased with current pulses ("Pulsing Mode").

According to one preferred embodiment of this invention, an apparatus and system for determining a color and brightness of LED 15 in printed circuit board 90 is shown in FIGS. 1-4. LEDs 15 are typically used in printed circuit boards 90 and require verification and determination of their operation in a different manner than the traditional manner of verification of the placement and operation of integrated circuits within printed circuit board 90. LEDs 15 are available in clear/white and several common colors such as red, green and blue. Beyond mere verification of the operation of LED 15, it is also preferable, and an object of this invention, to determine the color and brightness of LED 15, in part to confirm that such LED is in the desired position in printed circuit board 90 and functions as intended.

The apparatus according to a preferred embodiment of this invention includes sensor 10. As described in more detail below, sensor 10 comprises an assembly of components that may be used in connection with test systems and test fixtures for quickly and accurately determining a color and brightness of LED 15. The sensor 10, otherwise known as a MEGA FINN™ sensor, is preferably positioned in physical proximity to LED 15 to be tested. The sensor preferably includes a plurality of color receptors having different colors. The intensity of the detected light is related to the color of the object. An output signal from the device is thus proportional to the reflected light.

Figure 1:
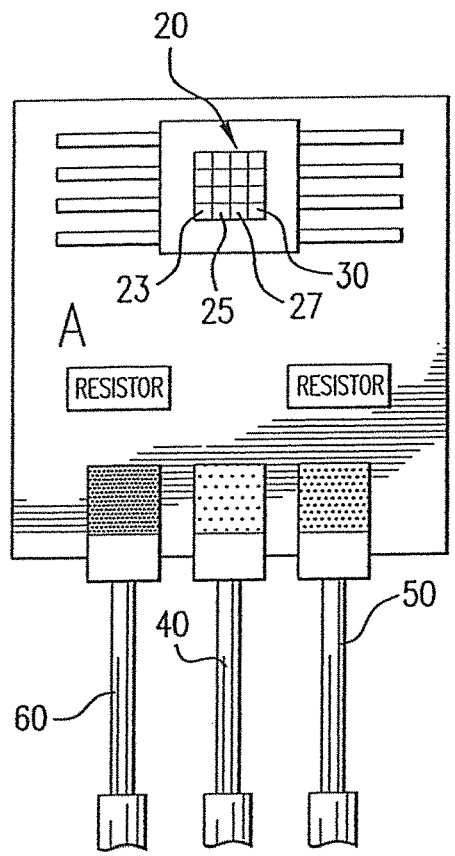
FIG. 1 is a schematic front view of a sensor according to one preferred embodiment of this invention.

According to one preferred embodiment of this invention, and as shown in FIG. 1, the sensor 10 preferably includes a plurality of filters 20 arranged in a matrix. Each filter 20 is preferably a discrete optical filter or color receptor which permits only light in a range about the target wavelength of the color to be detected to pass. As such, each filter 20 is preferably designed to detect a certain range of color, e.g. blue, red, green and/or clear. As shown in FIG. 1, the plurality of filters 20 preferably include: a plurality of clear receptors 23; a plurality of red receptors 25; a plurality of blue receptors 27; and/or a plurality of green receptors 30. However, the sensor 10 of this invention is not limited to these colors. Preferably, the different color receptors 23, 25, 27 and 30 are interspersed within the matrix. An example of such a filter 20 is manufactured by AMS-TAOS Inc. of Plano, Tex., part number TCS 3200.

Figure 2:
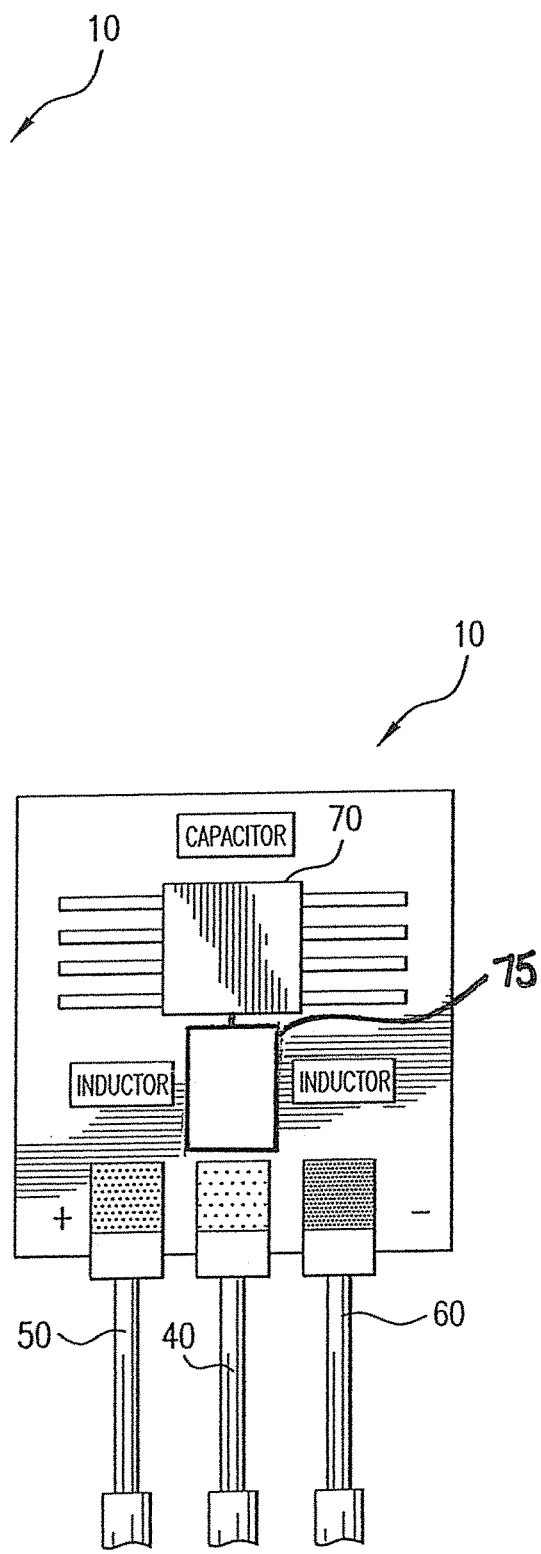
FIG. 2 is a schematic rear view of the sensor shown in FIG. 1.
Figure 3:
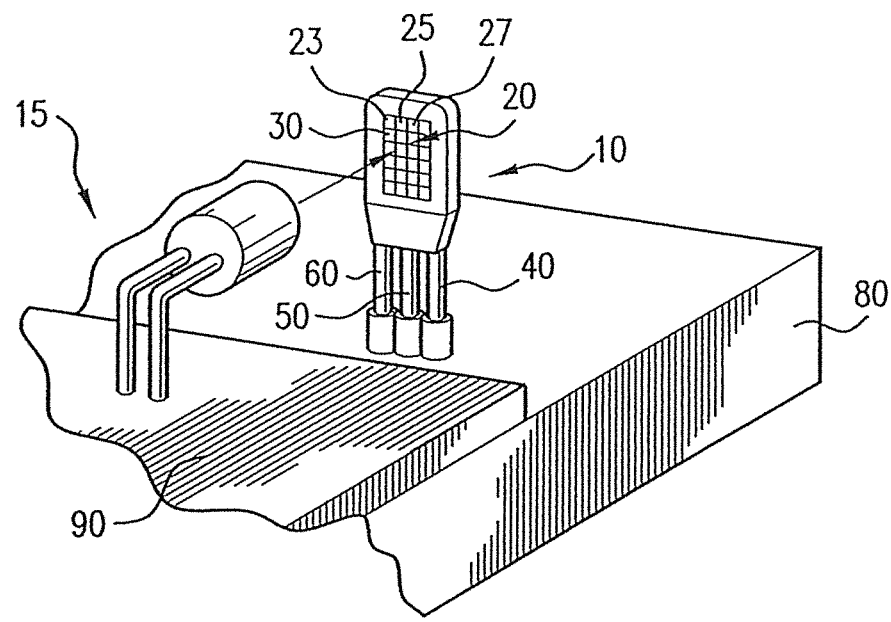
FIG. 3 is a diagrammatic perspective front view of a portion of a test fixture according to one preferred embodiment of this invention.
Figure 4:
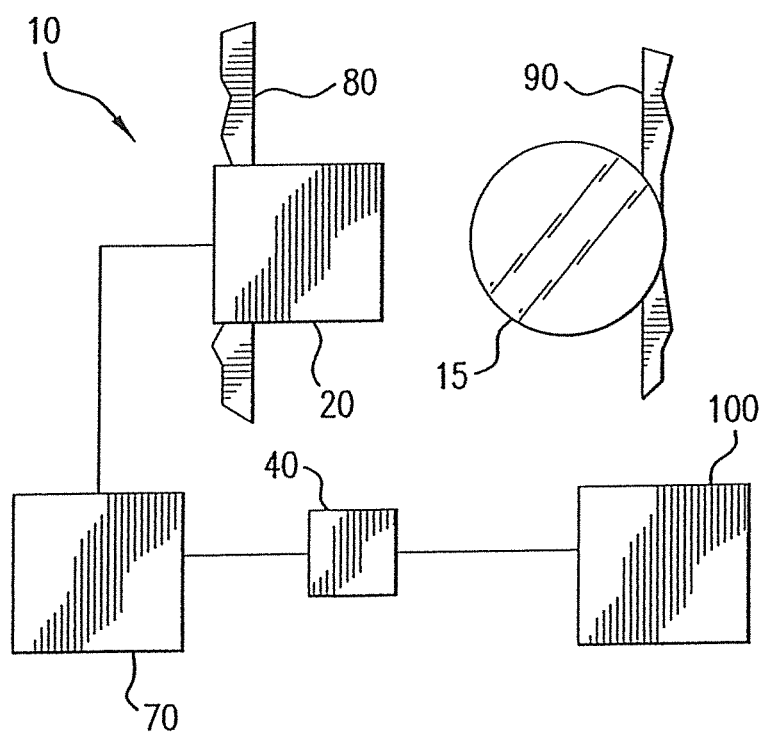
FIG. 4 is a schematic of test apparatus according to one preferred embodiment of this invention.

According to one preferred embodiment of this invention, sensor 10 includes a minimum amount of connections, or probes, to minimize the necessary set-up and installation of sensor 10. Accordingly, and as shown in FIGS. 1 and 2, sensor 10 preferably includes three probes, specifically, output probe 40, input probe 50 and ground probe 60. Output probe 40 is preferably connected to sensor 10 and provides a color output and a brightness output in a single signal. According to a preferred embodiment of this invention, this single signal is made possible by a method of operation described in more detail below. Such single signal through a single output probe 40 thereby simplifies the connections necessary to connect sensor 10 relative to LED 15 within the test system.

Input probe 50 is preferably connected to the sensor and provides power to sensor 10 from an external power source. Input probe 50 preferably accommodates an operating voltage between approximately 2.7 Vdc and 5.5 Vdc. Input probe 50 may draw power directly from a digital output. Ground probe 60 is preferably additionally connected to sensor 10 and is connected to an external ground.

As shown in FIGS. 1-4, microprocessor 70 is preferably connected between filters 20 and output probe 40 and calculates the color and the brightness of LED 15. Microprocessor 70 may be programmable to permit modifications of sensor 10 based upon variables within the system to be tested such as LEDs 15 having atypical colors, brightness, positions, ambient conditions and other parameters that may require customization and/or programming of microprocessor 70.

According to one preferred embodiment of this invention and depending upon the application, probes 40, 50 and/or 60 each may configured in a straight path, may each include a 90° bend, may be pre-formed into other configurations and/or may be bendable to permit forming into suitable configurations.

According to one preferred embodiment of this invention, as shown in FIG. 2, sensor 10 preferably further includes an oscillator 75 that provides fast speed, higher accuracy and response times allowing the sensor 10 quickly take samples, such as when the LED 15 is biased with a current pulse. In an embodiment, the oscillator 75 may comprise an external oscillator.

In a preferred embodiment, the oscillator 75 connects to a processor 70 allowing the processor 70 to run at much faster speed and make faster and more accurate measurements of the color sensor. By running at much faster speed, the sensor 10 of this invention is able to detect changes in light, such as from a fast pulsing LED, and make quick and intelligent decisions on how to measure the sensor. Since the light from a pulsing LED is constantly changing the processor 70 needs to keep with fast and accurate measurement and also make fast calculation to find out the color of the light. The oscillator also allows the sensor 10 to operate with an Auto Triggering feature. When the light changes, the sensor 10 is able to quickly detect this change and auto trigger the processor 70 to start a fresh sample quickly and measure accurately.

In a preferred embodiment, the sensor 10 further includes a fuse and diodes to protect the sensor from overpowering and/or reverse wiring.

A color and a brightness of LED 15 is thereby determined with microprocessor 70 connected with respect to sensor 10 and a single output signal is sent from sensor 10 to some form of operator interface, such as a multimeter, a voltmeter, a counter or similar measuring device known to those having ordinary skill in the art.

Specifically, a color and brightness of LED 15 may be determined by sampling the output of LED 15 for a period of time. The period of time may be dependent upon the brightness of LED 15 and/or the color of LED 15. A count for each color receptor 23, 25, 27 and/or 30 is then determined based upon the given period of time. A sample or count across each color receptor 23, 25, 27 and/or 30 is then compared to determine the color of LED 15. As such, sensor 10 sequentially compares the count for clear receptor 23 with the count for red receptor 25 with the count for blue receptor 27 with the count for green receptor 30 so that the count for each color receptor is compared with the count of each other color receptor. Comparison of the counts for each filter 20 thereby yields a wavelength and, thus, the color of LED 15.

The following table provides typical measurements for various colors of particular LEDs 15.

TABLE 1

Characteristics of Specific Colors of LEDs

| LED Color | Wavelength (nm) | mcd | Frequency (kHz) | Vdc |
| --- | --- | --- | --- | --- |
| Red | 635 | 150 | 12.0 | 3.5 |
| Amber | 608 | 10 | 10.6 | 1.0 |
| Yellow | 585 | 150 | 9.38 | 2.8 |
| Green | 565 | 150 | 8.68 | 2.0 |
| Blue | 430 | 100 | 6.90 | 3.4 |

In addition, the wavelength of the color is converted to a frequency. A relationship of the count relative to the frequency of the single output signal is then calculated to determine the color of LED 15. The frequency is further encoded with a pulse width and a DC average of the pulse width is measured to obtain the brightness of LED 15.

According to one preferred embodiment of this invention, sensor 10 may additionally detect white light and provide a signal indicating the presence of a broad range of colors in the light and/or the brightness of white light. If a dominant color is present within the white light, sensor 10 will preferably indicate such dominant color within the single output signal.

According to one preferred embodiment of this invention, a method for determining a color and brightness of LED 15 may be used in connection with printed circuit board 90 having a plurality of LEDs 15. A corresponding plurality of sensors 10 may thereby be positioned on test fixture 80 and printed circuit board 90 is then preferably positioned within test fixture 80 so that each sensor 10 is positioned directly adjacent an LED 15. According to two common configurations of LEDs 15 on printed circuit boards 90, LEDs 15 are positioned so that a light emitting surface is either positioned on an edge of printed circuit board 90 and thus perpendicular to surface of printed circuit board 90 or positioned in an interior area of printed circuit board 90 and thus parallel to surface of printed circuit board 90. Depending upon such configuration, probes 40, 50 and 60 may be correspondingly configured to permit direct light access from LED 15 to adjacent sensor 10. As such, probes 40, 50 and 60 may include an entirely straight length, a partially straight length or an entirely bent and/or curved length and/or some combination thereof.

According to one preferred embodiment of this invention, whether a light emitting surface of LED 15 is parallel or perpendicular to printed circuit board 90, sensor 10 is positioned at least approximately 0.10" away from the light emitting surface and up to approximately 0.20" or more away from the light emitting surface of LED 15. Factors such as the strength of the light source, the intensity of the light source and the amount of ambient light may result in variations of a preferred position of sensor 10 relative to LED 15. A center of an active region of sensor 10, likely a center of the matrix of filters 20, is preferably aligned with a center of a lens of LED 15.

Figure 5:
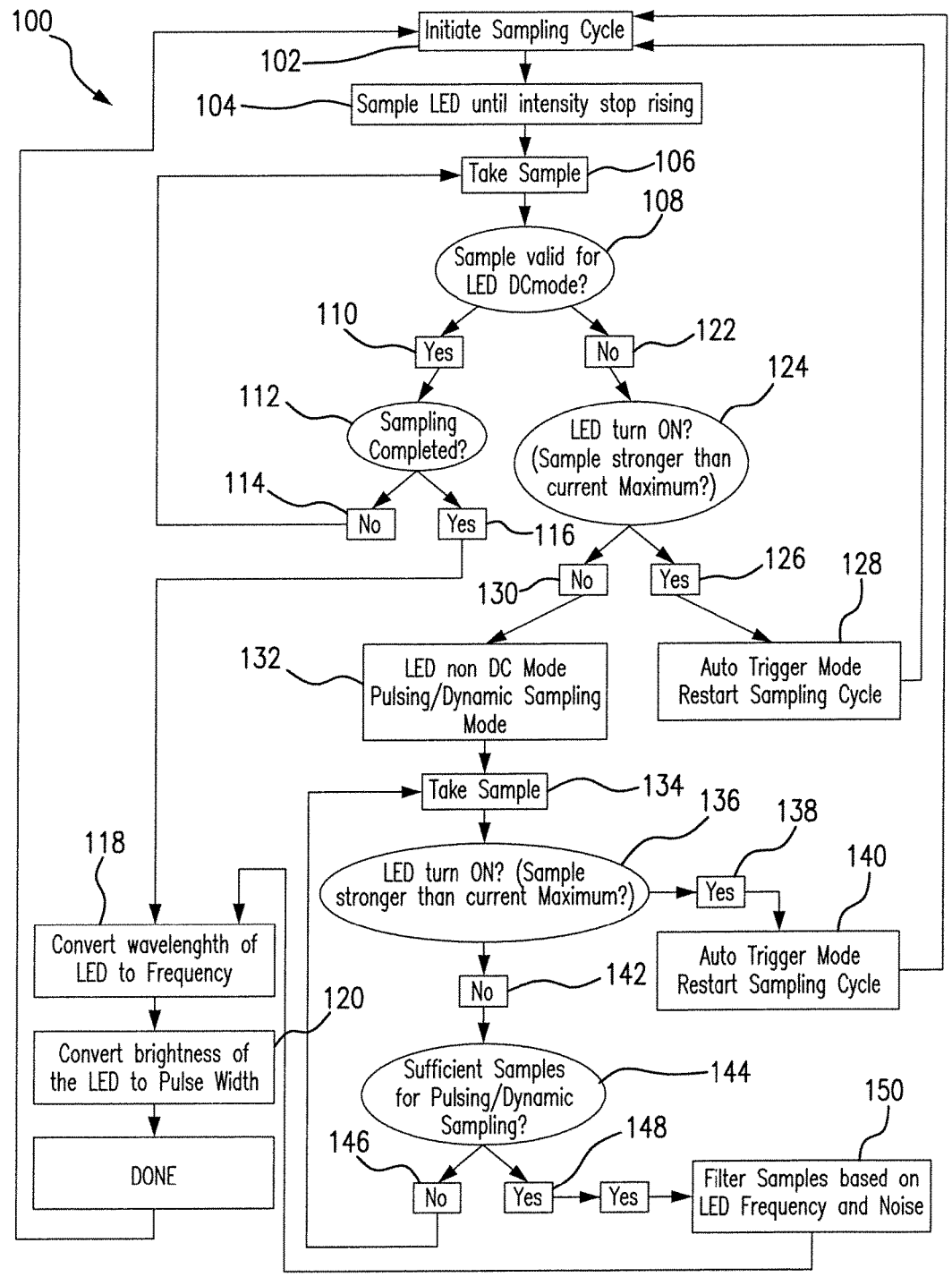
FIG. 5 is a flow chart of the operation of a device according to one preferred embodiment of this invention.

As shown schematically in FIG. 5, a method 100 for testing an output of LED 15 according to a preferred embodiment of this invention includes positioning sensor 10 adjacent LED 15 having an unknown color and brightness. As discussed above, sensor 10 includes a plurality of color receptors, preferably arranged in a matrix. Prior embodiments can accurately sample the LED in "DC Mode", where the LED is biased with a constant current during the entire time interval of the sample. The method of this invention can also accurately sample the LED when the LED is biased with current pulses, herein referred to as "Pulsing Mode." The Pulsing Mode requires more complex sampling techniques which can be time consuming.

The method starts by initiating sampling cycle 102 and sampling the LED 15 until intensity stops rising 104. In a preferred embodiment, the start of the LED sampling is auto-triggered to start the LED sampling when LED turns on. Auto-triggering eliminates the need for separate triggering signal or command. Auto-triggering also saves time by terminating a sample cycle begun before the LED was biased. In addition, an erroneous measurement is avoided by not processing a corrupt sample.

The sample is taken 106 and evaluated to determine if the LED is biased in DC mode 108. If in the LED is operating in DC mode 110, the method 100 determines if the sampling was completed 112. If the sample is not completed 114, the method of this invention preferably re-takes the sample 106 and the process described above restarts. If the sampling is completed 116, the method 100 converts wavelength of the LED to frequency 118 and converts brightness of the LED to pulse width 120. This step may include determining a count for each color receptor of the plurality of color receptors of the sensor. The device then converts a wavelength of the color of the LED to a frequency. From the frequency, the device preferably determines the brightness of the LED from a relationship of the count relative to the frequency. Next, the frequency is encodes to a pulse width and the DC average of the pulse width is measured to obtain the color of the LED. Lastly, a single output signal is sent from the sensor that includes one or more determinations of the color, brightness and/or presence of the LED.

If the LED is determined to not be operating in DC mode 122, the sample is further evaluated to determine a proper sampling interval based on LED frequency and noise. In this manner, the device according to this invention, adaptively changes a sampling time of the LED based on frequency and noise. If the LED is determined to not be operating in DC mode 122, the LED is then checked to determine if the LED is on 124. Specifically, the process 100 determines if the sample is stronger than a current maximum. If the LED is on 126, the auto trigger mode restarts the sampling cycle 128 and the process above repeats.

If it is determined that the LED is off 130, the method 100 of this invention operates in non-DC mode, known as pulsing mode or dynamic sampling mode, and a dynamic sample is taken 134. First, the LED is then checked to determine if it is on 136. If the LED is on 138, the auto trigger mode restarts the sampling cycle 140 and the process above repeats.

If in step 136, the LED is determined to be off 142, the process determines if sufficient samples for pulsing/dynamic sampling have been taken 144. If sufficient samples have not been taken for pulsing/dynamic sampling 146, the process returns to step 134, another sample is taken and the process described above repeats.

If sufficient samples have been taken for pulsing/dynamic sampling 148, the samples are filtered 150 based on LED frequency and noise. Next, the method 100 converts wavelength of the LED to frequency 118 and converts brightness of the LED to pulse width 120. This step may include determining a count for each color receptor of the plurality of color receptors of the sensor. The device then converts a wavelength of the color of the LED to a frequency. From the frequency, the device preferably determines the brightness of the LED from a relationship of the count relative to the frequency. Next, the frequency is encodes to a pulse width and the DC average of the pulse width is measured to obtain the color of the LED. Lastly, a single output signal is sent from the sensor that includes one or more determinations of the color, brightness and/or presence of the LED.

Figures 6, 7:
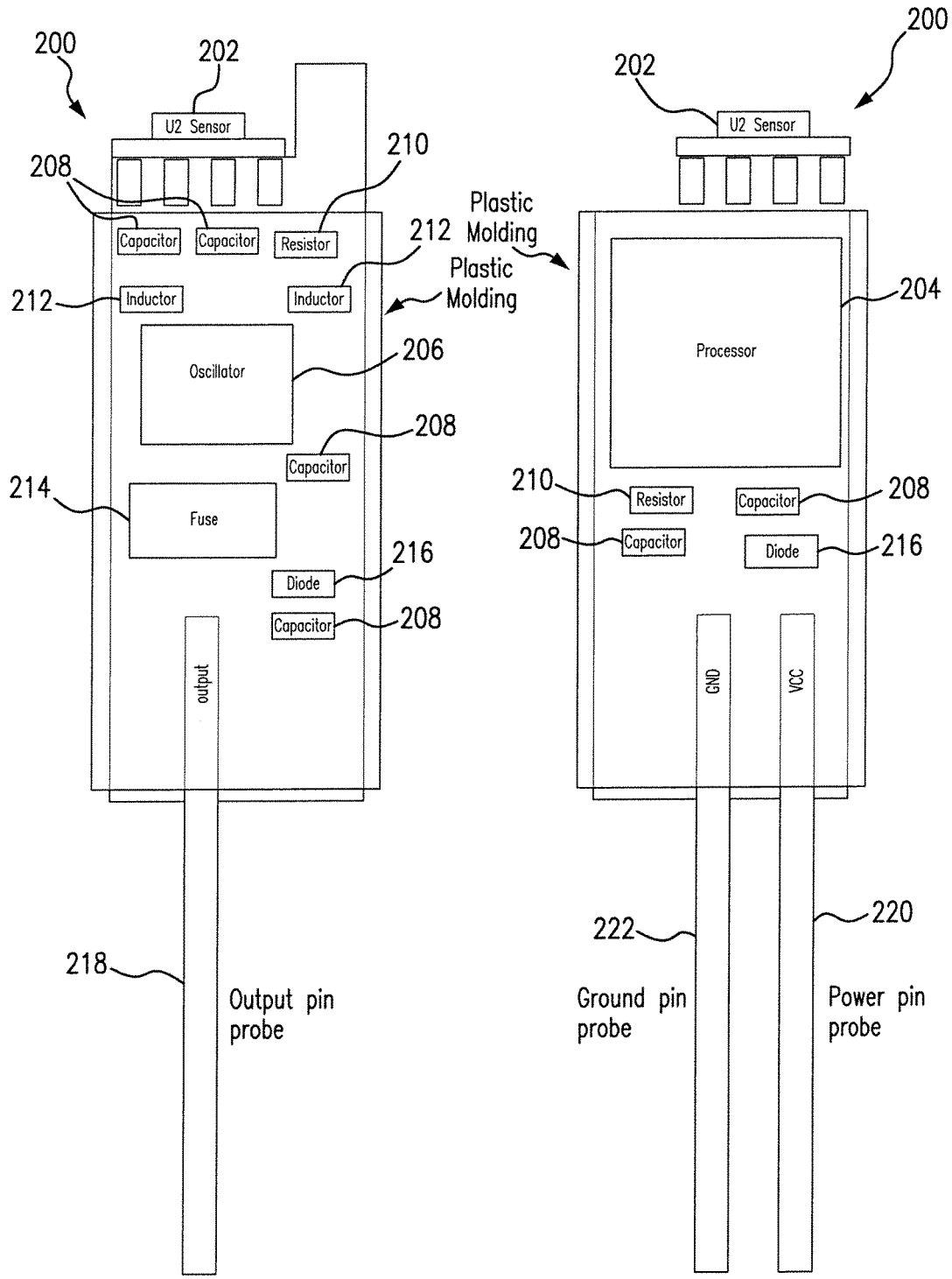
FIG. 6 is a schematic top side view of a sensor according to another preferred embodiment of this invention.
FIG. 7 is a schematic bottom side view of the sensor shown in FIG. 6.

FIGS. 6 and 7 show another embodiment of the sensor 200 of this invention. In this embodiment, the sensor 200 includes a U 2 sensor 202, a microprocessor 204, an oscillator 206, a plurality of capacitors 208, a plurality of resistors 210, a plurality of inductors 212, a fuse 214, a diode 216, an output probe 218, a power probe 220 and a ground probe 222.

In this embodiment, the U 2 sensor 202 preferably includes a plurality of filters. Each filter is preferably a discrete optical filter or color receptor which permits only light in a range about the target wavelength of the color to be detected to pass.

According to one preferred embodiment of this invention, sensor 200 includes a minimum amount of connections, or probes, to minimize the necessary set-up and installation of sensor. The output probe 218 is preferably connected to sensor and provides a color output and a brightness output in a single signal. The power probe 220 is preferably connected to the sensor and provides power to sensor from an external power source. The ground probe 222 is preferably connected to an external ground.

In this embodiment, the microprocessor 204 connected between the filters and the output probe and calculates the color and the brightness of the LED. The microprocessor may be programmable to permit modifications of sensor based upon variables within the system to be tested such as LEDs having atypical colors, brightness, positions, ambient conditions and other parameters that may require customization and/or programming of microprocessor. The microprocessor 204 is preferably also connected to the oscillator 206. The oscillator allows the processor 204 to run at much faster speed and make faster and more accurate measurements of the color sensor. By running at much faster speed, the sensor 202 is able to detect changes in light, such as from a fast pulsing LED.

In a preferred embodiment, the fuse 214 and the diode 216 protect the sensor 200 from damage.

Figure 8:
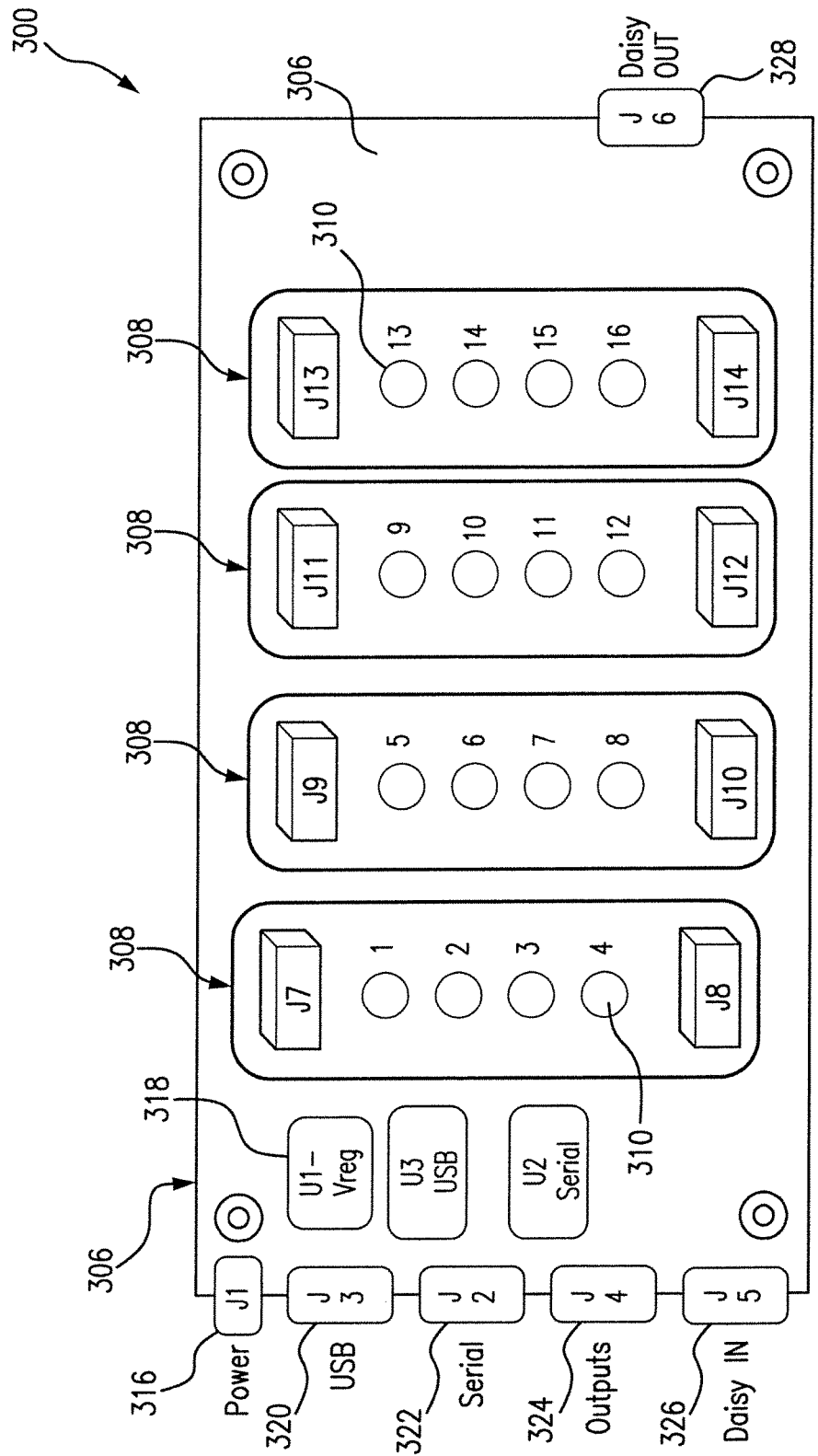
FIG. 8 is schematic representation of enclosure module according to an embodiment of this invention for testing a plurality of components.

FIG. 8 shows another embodiment of this invention. In this embodiment, the apparatus for determining the presence and operation of a plurality of components in a printed circuit board includes an enclosure module 300 housing a plurality of sensors 310. The enclosure module 300 provides a simple, easy to mount assembly for testing presence, brightness, and color of a plurality of components, including LEDs, resistors, capacitors, processors, and other similar components in a printed circuit board at one time.

FIG. 8 shows a schematic representation of the enclosure module 300. In this embodiment, the enclosure module 300 comprises a main printed circuit board 306 with a plurality of sensor boards 308, each sensor board 308 including a plurality of sensors 310. Each sensor 310 including a plurality of color receptors. In this embodiment, the printed circuit board 306 includes four sensor boards 308, each of the sensor boards 308 including four sensors 310. Allowing the enclosure module 300 to test up to 16 components at a time. However, the enclosure module 300 of this invention is not limited to this number of sensor boards and sensors and may comprise any number of sensor boards and sensors.

Figure 9:
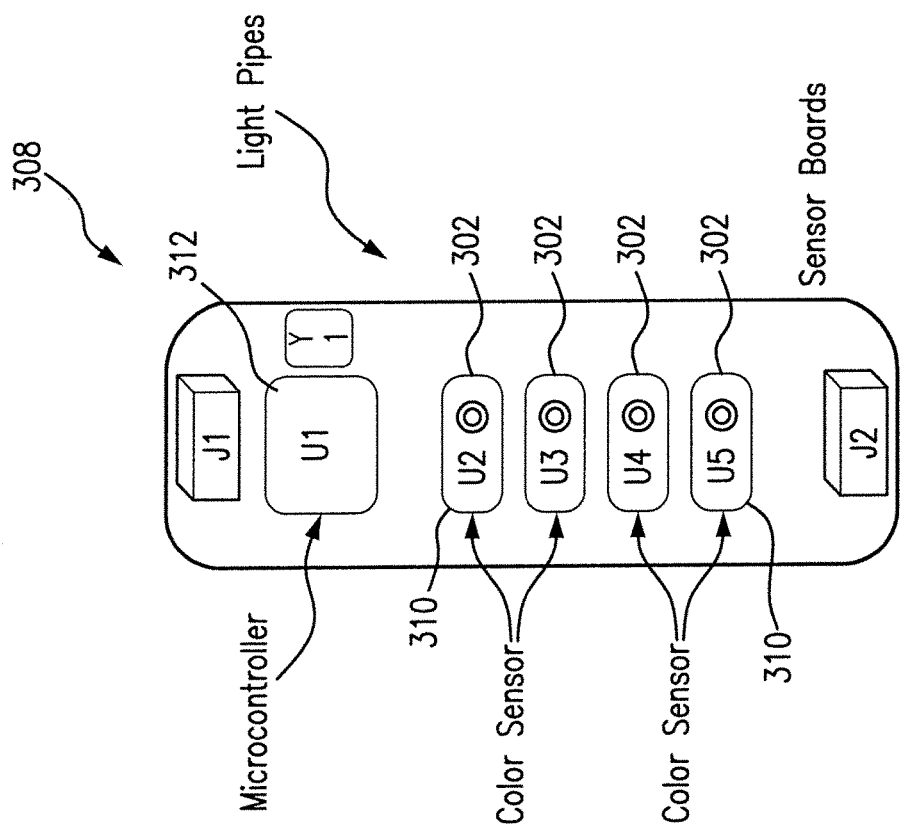
FIG. 9 is a schematic representation of a sensor board according to an embodiment of this invention.

In a preferred embodiment, the sensor board 308 comprises a FINN device that includes sensors mounted on individual printed circuit board within the enclosure module 300. One embodiment of the FINN device is described in connection with FIGS. 1-4. FIG. 9 shows a schematic representation of another embodiment of the FINN device separate from the enclosure module 300. As shown, the sensor board 308 includes a microcontroller 312 controlling a plurality of the sensors 310. The sensors 310 are connected to fiber optic cables 302 that extend to the components to be tested. The sensors 310 preferably includes a plurality of color receptors 304 for testing different colors. The intensity of the detected light is related to the color of the object. An output signal from the device is thus proportional to the emitted or reflected light.

Figure 10:
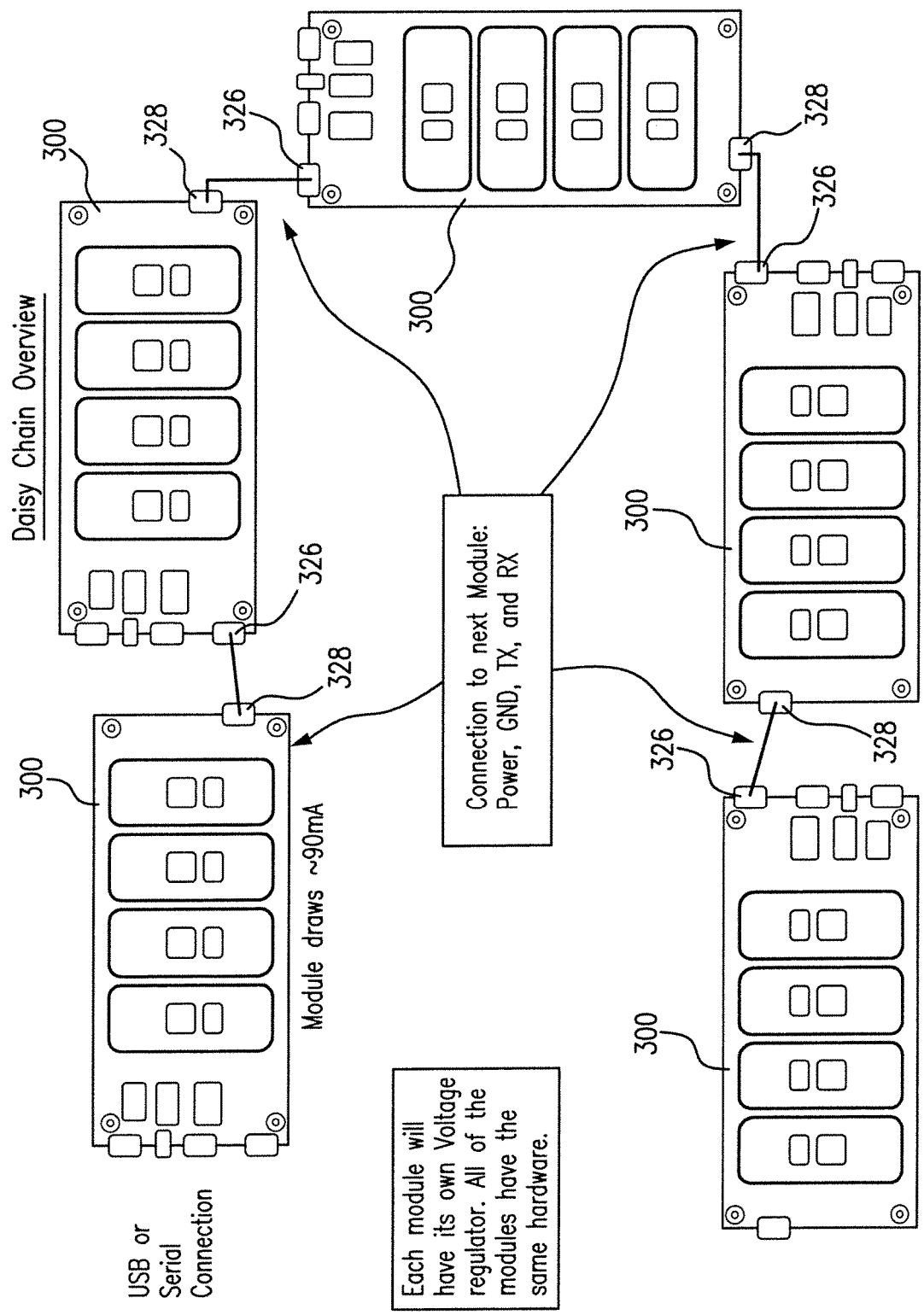
FIG. 10 is a schematic representation of enclosure modules connected in a daisy chain configuration.

Referring back to FIG. 8, the enclosure module 300 preferably further includes a power connector 316, a voltage regulator 318, a USB connector 320, a serial port connector 322, outputs 324, a daisy chain input connector 326 and a daisy chain output connector 328. The outputs 322 preferably comprise color/intensity outputs in voltage and frequency. In a preferred embodiment, the enclosure module 300 can be daisy-chained together to test up to 254 LEDs or more with only one input interface. FIG. 10 is a schematic representation of five enclosure modules 300 connected as a daisy chain.

In an embodiment of the invention, the enclosure module 300 includes four sensor boards 308 which each have a total for four color sensors 310 with fiber optics. When the enclosure module 300 receives a command from the USB or the serial connectors, a first sensor board decodes a message received. If the message contains a sensor number which is within range of the first sensor board, then the first sensor board will sample a proper color sensor on the first sensor board and the first sensor board will send back the color and intensity readings for the selected component. If the message contains a sensor number outside the range of the first sensor board, then the first sensor board will forward the message to the second sensor board. The second sensor board will decode the message and if the sensor number is outside the second sensor board number range then the second sensor board will forward the message to the next sensor board. This process will repeat until a proper sensor board and sensor number is located in order to test a selected component. The sensor boards inside a single enclosure module will communicate with each other with an internal daisy chain connection. Different enclosure modules and the associated sensor boards will communicate with each other via the external daisy chain connection.

Operation of the enclosure module 300 is described in connection with FIG. 5. The method includes positioning the enclosure module in proximity to the circuit board to be tested and connection each sensor 310 to a respective component that requires verification and determination of presence, brightness, and/or color. As discussed above, the enclosure module 300 will test each component in either a DC mode or a pulsing mode depending on the operation of the component.

Thus, the subject invention is a cost effective method of identifying object presence, brightness, and/or color of multiple components including LEDs.

While in the foregoing specification this invention has been described in relation to certain preferred embodiments thereof, and many details have been set forth for purpose of illustration, it will be apparent to those skilled in the art that the method and apparatus according to this invention are susceptible to additional embodiments and that certain of the details described herein can be varied considerably without departing from the basic principles of the invention.

I claim:

1. A method for determining presence, brightness and/or color of components in a printed circuit board, the method comprising:
    connecting an enclosure module to the printed circuit board, the enclosure module including a plurality of sensor boards, each sensor board including a microcontroller and a plurality of sensors and a plurality of fiber optic cables, and each sensor including a plurality of color receptors, wherein at least one of the plurality of sensors is connected to a respective component with one of the plurality of fiber optic cables;
    providing an oscillator in combination with the plurality of sensor boards to allow the microcontroller and the plurality of sensors to operate at a high speed to detect fast changes in light from the LED;
    dynamically sampling with the plurality of color receptors and the microcontroller a light output of each of the components in a DC mode or a pulsing mode;
    determining with the microcontroller a count for each color receptor of the plurality of color receptors for each sensor;
    converting with the microcontroller a wavelength of a color to a frequency for each component;
    determining with the microcontroller a brightness of the component from a relationship of the count relative to the frequency for each component;
    encoding with the microcontroller the frequency to a pulse width for each component; and
    measuring with the microcontroller at least one of a DC average of the pulse width to obtain the brightness of each component.

2. The method of claim 1, wherein at least one of the components comprises an LED.

3. The method of claim 1, wherein the method begins with an auto trigger start of the sampling when at least one of the components turns on.

4. The method of claim 1, further including filtering samples based on component frequency and noise.

5. The method of claim 1, connecting a plurality of the enclosure modules as a daisy chain.

6. The method of claim 5, wherein the plurality of the enclosure modules include only one input interface.

7. The method of claim 5, wherein the plurality of the enclosure modules test up to 254 components.

8. An apparatus adapted to perform the method of claim 1, the apparatus comprising:
    the enclosure module housing the plurality of sensor boards, each sensor board including the microcontroller and the plurality of sensors, each sensor including the plurality of color receptors;
    the plurality of fiber optic cables, each fiber optic cable connected to a respective sensor and connectable to one of the components in the printed circuit board;
    an input providing power to the enclosure module;
    the output for providing data regarding the presence, brightness and/or color of components;
    a processor connected to the sensors for calculating at least one of the brightness and color of the components;
    an oscillator connected to the processor to allow the processor to operate at a high speed to detect fast changes in a light from the component; and
    wherein the apparatus operates in the DC mode when the component is biased with a constant current and in the pulsing mode when the component is biased with a current pulse.

9. The apparatus of claim 8, wherein at least one of the components comprises an LED.

10. The apparatus of claim 8, wherein each sensor comprises:
    a plurality of clear receptors;
    a plurality of red receptors;
    a plurality of blue receptors; and
    a plurality of green receptors.

11. The apparatus of claim 8, wherein the enclosure module includes a daisy chain input and a daisy chain output.

12. The apparatus of claim 11, wherein up to sixteen enclosure modules are connected as a daisy chain.

13. The apparatus of claim 8, wherein the enclosure module includes the input, and wherein the input comprises one of a USB and a serial interface.

* * * * *